United States Patent
Higashisaka et al.

(10) Patent No.: US 9,997,386 B2
(45) Date of Patent: Jun. 12, 2018

(54) SUBSTRATE HOLDER MOUNTING DEVICE AND SUBSTRATE HOLDER CONTAINER CHAMBER

(75) Inventors: Ryuji Higashisaka, Kawasaki (JP); Hideki Wakabayashi, Tokyo (JP)

(73) Assignee: Canon Anelva Corporation, Kawasaki-shi (JP)

( * ) Notice: Subject to any disclaimer, the term of this patent is extended or adjusted under 35 U.S.C. 154(b) by 570 days.

(21) Appl. No.: 13/069,453

(22) Filed: Mar. 23, 2011

(65) Prior Publication Data

US 2011/0168086 A1 Jul. 14, 2011

Related U.S. Application Data

(63) Continuation of application No. 12/624,944, filed on Nov. 24, 2009, now abandoned, which is a (Continued)

(51) Int. Cl.
  *B05C 13/02* (2006.01)
  *H01L 21/673* (2006.01)

(52) U.S. Cl.
  CPC .. *H01L 21/67313* (2013.01); *H01L 21/67346* (2013.01)

(58) Field of Classification Search
  CPC ......... H01L 21/67712; H01L 21/67757; H01L 21/67715; H01L 21/6773; H01L 21/6776; (Continued)

(56) References Cited

U.S. PATENT DOCUMENTS 5,203,445 A 4/1993 Shiraiwa
6,228,429 B1 * 5/2001 Bluck et al. .................. 427/331
(Continued)

FOREIGN PATENT DOCUMENTS

JP 63-59137 4/1988
JP 01-316457 A 12/1989
(Continued)

OTHER PUBLICATIONS

International Search Report and Written Opinion in related corresponding PCT Japanese Patent Application No. PCT/JP2008/067737.
(Continued)

*Primary Examiner* — Karla A Moore
*Assistant Examiner* — Tiffany Z Nuckols
(74) *Attorney, Agent, or Firm* — Fitzpatrick, Cella, Harper & Scinto (57) ABSTRACT

A substrate holder mounting device is provided that is compact and has a simple structure. The substrate holder mounting device according to the present invention is provided with: a first and a second mounting mechanisms (5, 7) that are housed in a chamber and that are respectively configured to be capable of mounting a plurality of substrate holders along a row; row direction drive means that moves the first mounting mechanism to a row direction relatively with respect to the second mounting mechanism; a shifting mechanism (30) that shifts the substrate holders between the first and second mounting mechanisms; and a link-up mechanism that changes positions of the substrate holders in the row direction in the first or second mounting mechanism by a linkage between the shifting mechanism and the above-described row direction drive means.

7 Claims, 9 Drawing Sheets

Related U.S. Application Data continuation of application No. PCT/JP2008/067737, filed on Sep. 30, 2008.

(58) Field of Classification Search
CPC .......... H01L 21/67775; C23C 16/4587; C23C 14/567
USPC ................ 118/728–732; 156/345.51–345.55; 414/416.01, 416.03, 416.08
See application file for complete search history.

(56) References Cited

U.S. PATENT DOCUMENTS

| | | | | |
|---|---|---|---|---|
| 6,319,373 | B2* | 11/2001 | Takeyama | ..................... 118/719 |
| 6,919,001 | B2* | 7/2005 | Fairbairn | .............. C23C 14/568 |
| | | | | 118/719 |
| 2002/0172580 | A1* | 11/2002 | Mueller | ................ B23P 19/001 |
| | | | | 414/331.14 |
| 2005/0115830 | A1 | 6/2005 | Furukawa et al. | |
| 2008/0178796 | A1 | 7/2008 | Furukawa et al. | |

FOREIGN PATENT DOCUMENTS

| | | |
|---|---|---|
| JP | 03-056668 A | 3/1991 |
| JP | 05-270610 A | 10/1993 |
| JP | 2000-216212 A | 4/2000 |
| JP | 2002-288888 A | 10/2002 |
| JP | 2005-120412 A | 5/2005 |

OTHER PUBLICATIONS

Japanese Official Letter dated Aug. 7, 2012, in related corresponding Japanese Patent Application No. 2009-168891 (with English translation).

* cited by examiner

SUBSTRATE HOLDER MOUNTING DEVICE AND SUBSTRATE HOLDER CONTAINER CHAMBER

CROSS-REFERENCES TO RELATED APPLICATIONS

This application is a continuation of application Ser. No. 12/624,944, filed on Nov. 24, 2009, which is a continuation application of International Application No. PCT/JP2008/067737, filed on Sep. 30, 2008, the entire contents of which are incorporated by reference herein.

BACKGROUND ART

As a measure against a deposited film on a substrate holder generated in an in-line type substrate processing device, an exchange system of the substrate holders using a substrate holder container chamber is disclosed in Patent Document 1.

The substrate holder container chamber disclosed in Patent Document 1 is provided with a radially arranged plurality of carrying rails with carrying rollers, and a carrying rail rotating mechanism that rotationally drives the carrying rails with a center of radiation being as an axis, and substrate holders can be loaded on each carrying rail. The system described above is a system in which the substrate holders in the container chamber is carried out (collected) to the in-line type substrate processing device by rotationally carrying this carrying rails to a carrying-in/out opening (one opening) provided at the container chamber.

Patent Document 1: Japanese Patent Application Laid-Open No. 2005-120412

DISCLOSURE OF THE INVENTION

However, there have been following problems or issues on the above system.

(1) Reduction in Size of Substrate Holder Container Chamber

As described above, in a conventional art, a rotary system is employed for housing the substrate holders, thus requiring a radial arrangement of the carrying rails. An arrangement radius of the carrying rails is determined by the number of built-in rails and a rail spacing, and when the number of the built-in rails become larger, they are required to be arranged spaced apart from a center of radiation, thus resulting in expansion of the arrangement radius. In addition, as a feature of the radial arrangement, a carrying rail spacing near a center expands toward an outer periphery according to an angle of radiation, so that a useless space occurs at the outer periphery.

These problems have made it difficult to reduce a size of the substrate holder container chamber.

(2) Structure Simplification

In the conventional art, there have been problems that the carrying rollers to the in-line type substrate processing device are required for all the carrying rails of radial arrangement, and a number of carrying parts are used and prices thereof are high. Simultaneously, carrying adjustment for all the carrying rails is required, thus having required a long time for adjustment work.

(3) Improvement of Heating Efficiency

In the conventional art, radial arrangement of the container substrate holders causes an arrangement range of the substrate holders to be larger, so that it has been difficult to arrange a heater for heating all the substrate holders. Consequently, it has been required that the heater for heating the substrate holders be fixed to two points of a ceiling, and that the substrate holders be rotated by a rotating mechanism to secure a temperature distribution when heating. With the conventional system, there has been a small input amount of heat per each substrate holder, and required much time for heating for degassing including rising temperature.

According to one embodiment of the present invention, a substrate holder mounting device is characterized by being provided with a table mechanism that can mount a plurality of substrate holders and that is movable in an arrangement direction, an up/down mechanism for separating the substrate holders from the table mechanism, and a link-up mechanism that moves positions of the substrate holders on the table mechanism by a linkage between the table mechanism and the up/down mechanism.

According to the present invention, the carrying rails can be arranged in parallel instead of being radially arranged, which can bring such advantages as simplification of a device configuration and space-saving of the device. According to the present invention, it becomes possible to reduce size of a chamber and also to improve efficiency of heating.

BRIEF DESCRIPTION OF THE DRAWINGS

FIGS. 8A to 8K is a flow diagram of carrying a substrate holder out of the substrate holder container chamber 18 to an adjacent chamber;

FIGS. 10A to 10E is a flow diagram of carrying a substrate holder out of an adjacent chamber into the substrate holder container chamber 18; and FIGS. 11A to 11E is a flow diagram of carrying out a substrate holder according to an other embodiment of the present invention.

Carrying mechanism 20
Drive source 21
Rotational direction conversion mechanism 22
Carrying magnet 23
Shifting mechanism 30
Carrying roller 31
Carrying base 32
Drive shaft 33
Drive device 34
Heater 4

Movable table 5
Table body 51
Groove 51*a*
Drive mechanism 52
Nut 52*a*
Guide portion 52*b*
Controller 6
Separation mechanism 7
Units 7A and 7B
Mounting portion 71A
Horizontal portion 711*a*
Partition member 712*a*
Drive unit 72A
Substrate holder 8
Substrate 81
Magnet 82
Holder gripper 83
Projection 84

BEST MODES FOR CARRYING OUT THE INVENTION

[Description of Substrate Processing Device Configuration]

Figure 1:
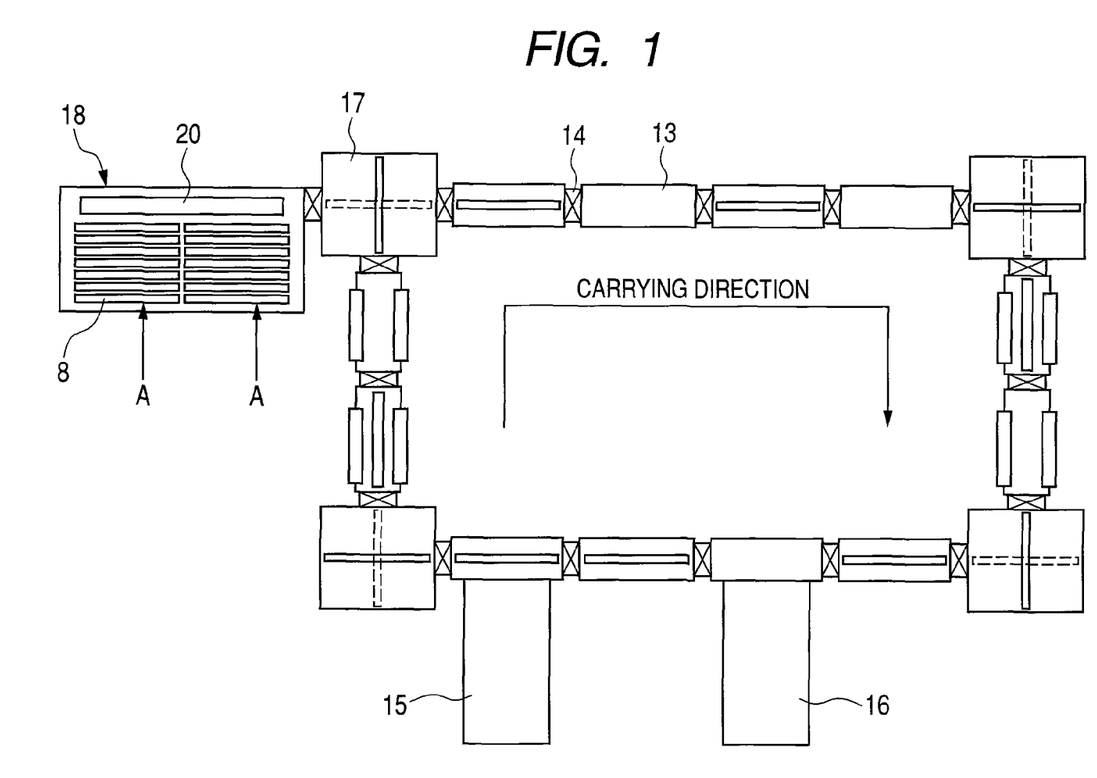
FIG. 1 is a plan view showing a schematic configuration of an in-line type substrate processing device according to the present embodiment.

FIG. 1 is a plan view showing a schematic configuration of an in-line type substrate processing device according to the present embodiment. Such the in-line type substrate processing device is, for example, used as a device for manufacturing magnetic disks. In the substrate processing device of the present embodiment, a plurality of vacuum chambers 13 are arranged in a state of being connected to each other in an endless form (rectangular-shaped loop in FIG. 1). Each vacuum chamber 13 is a vacuum container in which gases are exhausted by an exclusive or nonexclusive exhaust system. A gate valve 14 is arranged at a boundary of each vacuum chamber 13, and the vacuum chambers 13 are connected to each other with an airtight state being kept therein. A substrate is held to be carried by a substrate holder 8 through a substrate processing device. A transport path is provided in the plurality of connected vacuum chambers 13, and a magnet-type carrying mechanism, (which will be described hereinafter), is provided for transporting the substrate holders 8 along this transport path. Among the plurality of vacuum chambers 13 of the substrate processing device, two vacuum chambers 13 arranged at one side of the rectangular are a substrate supply chamber 15 that loads the substrate to the substrate holder 8 and a substrate eject chamber 16 that collects the substrate from the substrate holder 8. In addition, on corners of the rectangular, direction change chambers 17 are connected that are provided with direction change mechanisms for changing a carrying direction of the substrate holders 8 by 90 degrees. Further, a substrate holder container chamber 18 is connected to one of the direction change chambers 17 through the gate valve 14.

The substrate holder container chamber 18 has a substrate holder mounting device A that mount the plurality of substrate holders 8, a carrying mechanism 20 that carries the substrate holders 8 between the adjacent direction change chamber 17 and the substrate holder mounting device A, a shifting mechanism 30 (refer to FIG. 4) that shifts the substrate holders 8 between the substrate holder mounting device A and the carrying mechanism 20, and a heating mechanism (refer to FIG. 7) that heats the substrate holders 8. It is to be noted that in the present embodiment, the plurality of substrate holders 8 (for example, in two rows) are provided in parallel in the substrate holder mounting device A, and thus, more substrate holders 8 can be housed therein. In the substrate holder container chamber 18, new or recycled/cleaned substrate holders 8 are housed, and the substrate holders 8 on which films are deposited, which are collected from the substrate processing device in order to exchange the new or recycled/cleaned substrate holders 8, are also housed, thereby enabling to replace the substrate holders 8 without stopping magnetic disk production.

Figure 2:
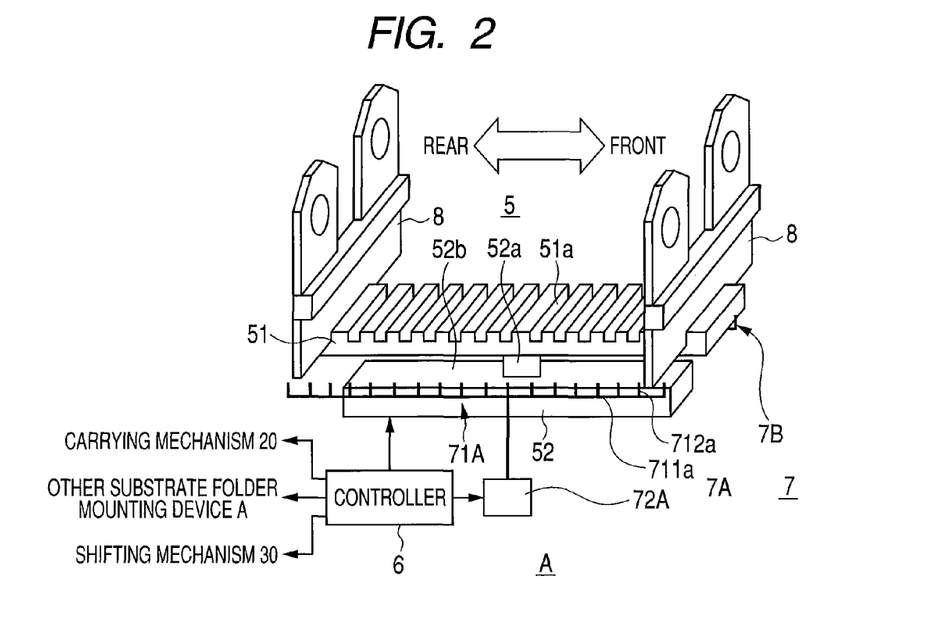
FIG. 2 is a perspective view of a substrate holder mounting device A.

There is shown in FIG. 2 a perspective view of the substrate holder mounting device A.

The substrate holder mounting device A is provided with a movable table (corresponding to a first mounting mechanism and a row direction drive means) 5 that mounts the substrate holders 8 arranged in parallel, a separation mechanism (corresponding to a second mounting mechanism) 7 constituted with units 7A and 7B that separate all the substrate holders 8 mounted on the movable table 5 therefrom at one time, and a controller (corresponding to a link-up mechanism) 6 that controls the above-described operations. Specifically, the movable table 5 has a table body 51 that can mount the plurality of substrate holders 8, and a drive mechanism 52 that drives the table body 51. A plurality of grooves 51*a* in which bottoms of the substrate holders 8 are fitted are provided on the table body 51 at equal intervals, and the table body 51 can mount the plurality of substrate holders 8 in a state where they are upright and arranged in a width direction of the substrate holders. The drive mechanism 52 reciprocates the table body 51 in a horizontal direction, i.e., a front/rear direction. In the present embodiment, an actuator of the drive mechanism 52 is constituted with a ball screw. The table body 51 includes a nut coupled with a coupling portion 52*a*, and the nut is screwed to a screw shaft extending in the front/rear direction of the table 51. The screw shaft is rotated by a rotation of a motor under control of a controller 6. The nut moves forward and backward by a rotation of the screw shaft, and thereby the table 51 coupled with the nut is moved forward and backward. It is to be noted that the actuator of the drive mechanism 52 is not limited to the ball screw, and cylinders, such as an air cylinder or a hydraulic cylinder, a magnet actuator directly made to act through magnetic coupling similar to the carrying mechanism 20 described hereinafter, etc. may be used.

In addition, in the present embodiment, the separation mechanism 7 is constituted with the rest units 7A and 7B arranged on both sides of the movable table 5. The unit 7A has a mounting portion 71A that can mount the bottoms of the substrate holders 8, and a drive unit 72A that drives the mounting portion 71A in an up/down direction. The mounting portion 71A has a horizontal portion 711*a* that extends in a row direction of the substrate holders 8, and a plurality of partition members 712*a* that extend in the up/down direction from the horizontal portion 711*a*, and that are arranged along the row direction of the substrate holders 8 at a predetermined spacing. One of the substrate holders 8 is mounted on one partition divided with the partition members 712*a*. Hence, an alignment spacing of this partition is the same as a spacing between the grooves 51*a* of the movable table 5, and the mounting portion 71A is configured to be capable of simultaneously mounting all the plurality of substrate holders 8 mounted on the movable table 5. In addition, in the present embodiment, the number of partitions formed on the mounting portion 71A of the separation mechanism 7 is set to not less than the number obtained by subtracting the number of the substrate holders carried by the carrying mechanism 20 per one time (for example, by subtracting the number of the grooves of the movable table 5 plus one).

The drive unit 72A that moves the mounting portion 71A of the separation mechanism 7 in an up/down direction is configured to be provided with the direct-acting actuator, such as a hydraulic cylinder. It is to be noted that the direct-acting actuator, which is not shown, is arranged outside the substrate holder container chamber 18, and only a drive shaft is arranged inside the chamber. Another unit 7B also has the same configuration as 7A.

Figure 3:
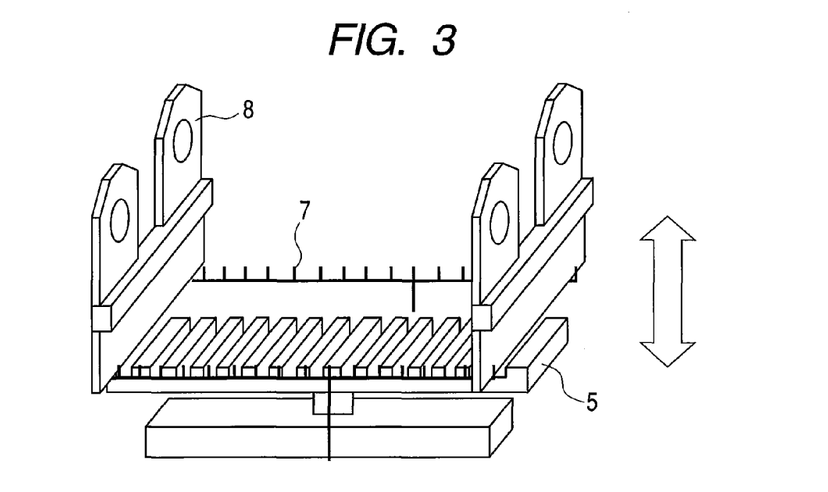
FIG. 3 is a perspective view of the substrate holder mounting device A.

As for the separation mechanism 7 that lifts all the substrate holders on the table 5 upwardly at one time, and that then separates them from the table, when the substrate holders 8 are mounted on the movable table 5, the mechanism is located at a retreat position, which is under the table 5, as shown in FIG. 2, while when the substrate holders are separated from the movable table 5, the mechanism is driven upwardly as shown in FIG. 3, and each of the units 7A and 7B lifts the substrate holders 8 from both sides to thereby separate them from the movable table 5. In addition, when lowering separation mechanism 7 from an upper position to the retreat position, the substrate holders 8 are shifted to the movable table 5.

In the present embodiment, the controller 6 is configured to have a general computer, and outputs a command to the movable table 5, the separation mechanism 7, the carrying mechanism 20, which is described hereinafter, and the shifting mechanism 30 based on a program, thereby achieving operations with cooperation among them. It is to be noted that the controller 6 is provided in common with the plurality of substrate holder mounting devices A arranged in the substrate holder container chamber 18, and it controls the devices, respectively.

Figure 4A:
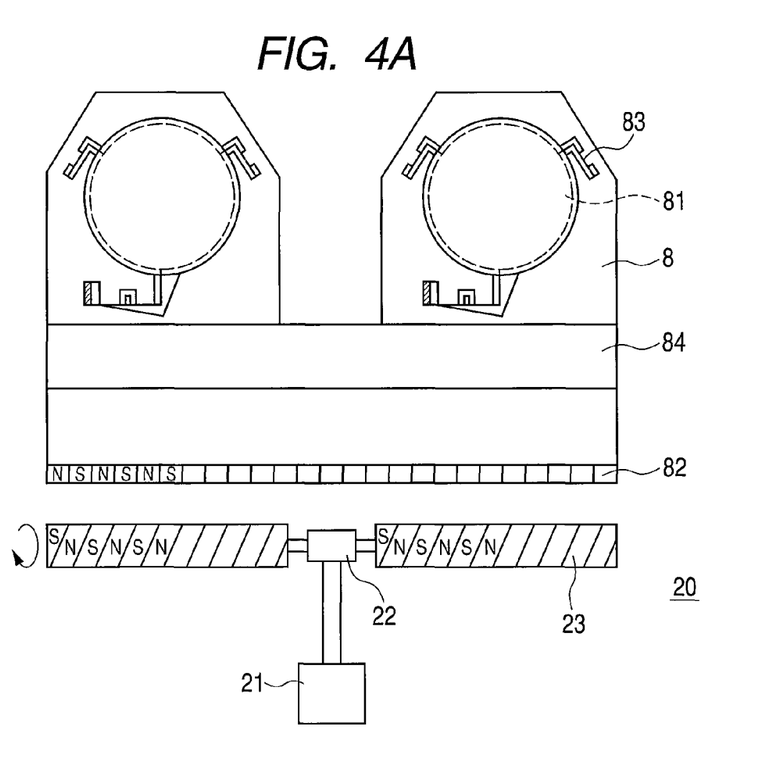
FIG. 4A is a view showing a substrate holder 8 and a carrying mechanism 20.
Figure 4B:
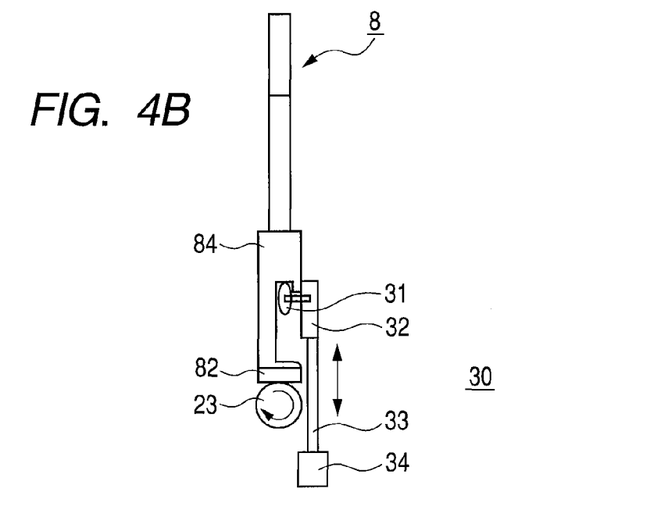
FIG. 4B is a view showing the substrate holder 8 and a shifting mechanism 30.

There are shown in FIG. 4A and FIG. 4B the substrate holder 8, the carrying mechanism 20, and the shifting mechanism 30. FIG. 4A is a view of the substrate holder 8 and the carrying mechanism 20 seen from the front direction, and FIG. 4B is a view of the substrate holder 8, the carrying mechanism 20, and the shifting mechanism 30 seen from a side of the substrate.

In the present embodiment, the substrate holder 8 holds one or a plurality of (two in FIG. 4A) substrate(s) 81 (a loading state is shown with a dashed line) so as to treat both sides of the substrate(s) in the vacuum chamber 13. As shown in FIG. 4A, the substrate holder 8 supports side surfaces of the substrates with a plurality of holder grippers 83, and thereby, it becomes possible to perform film formation treatment, etc. onto a whole surfaces of the substrates. In addition, a magnet 82 extending along a direction parallel to substrate surfaces is provided on a bottom of the substrate holder 8, and the substrate holder is carried along a direction to which the magnet 82 extends (lateral direction) by magnetically coupling it with the carrying mechanism 20.

The carrying mechanism 20 is a mechanism that after the substrate holder in a front row of the table 5 are taken out of the movable table 5 by the shifting mechanism 30 (FIG. 4B), the taken-out substrate holder is further carried. The carrying mechanism 20 has carrying magnets 23, a drive source 21 that generates a rotational driving force of a motor, etc., and a rotational direction conversion mechanism 22 that converts a rotation of the drive source 21 into a rotation around an axis of the carrying magnet 23. The carrying magnets 23 are members extending in a moving direction of the substrate holder, in which north pole and south pole magnets are arranged spirally, and by rotating this carrying magnets around the axis, the substrate holder 8 can be carried in the lateral direction that is shifted on the carrying magnets 23 by the shifting mechanism shown in FIG. 4 in a direction along the axis, and that is magnetically coupled with the carrying magnets. In the present embodiment, the carrying mechanism 20 that carries the substrate holder taken out of the table 5 is provided so as to be near the substrate holder mounting devices A arranged in parallel in the substrate holder container chamber 18, and to be shared by the plurality of substrate holder mounting devices A. The controller 6 controls a carrying direction, carrying timing, a carrying speed, etc. by outputting a drive signal to the drive source 21. It is to be noted that in the present embodiment, though not shown, the drive source 21 is provided outside the substrate holder container chamber 18, and the drive shaft is inserted into the chamber in a state of being surrounded by bellows (not shown). It is to be noted that in the application of the present invention, the carrying mechanism is not limited to a mechanism in which magnetic coupling is employed.

In addition, the shifting mechanism 30 shown in FIG. 4B is provided ahead of the carrying magnet 23, and is configured by providing a carrying roller 31, a carrying base 32, a drive shaft 33, and a drive device 34 for up/down drive, such as a cylinder. A bottom surface of the carrying roller 31, as shown in FIG. 4B, is engaged with a projection 84 of the substrate holder 8 so as to fit in each other, and thereby the roller faces the movable table side, and the plurality of carrying rollers 31 are provided along a carrying direction of the substrate holder 8. The carrying rollers 31 are rotatable so as to guide the substrate holder 8 along the carrying direction thereof. The drive device 34 drives the carrying roller 31 up and down based on the command from the controller 6, and achieves a shift operation of the substrate holder 8 to the movable table 5 by engaging or non-engaging the carrying roller 31 to the substrate holder 8.

Figure 5:
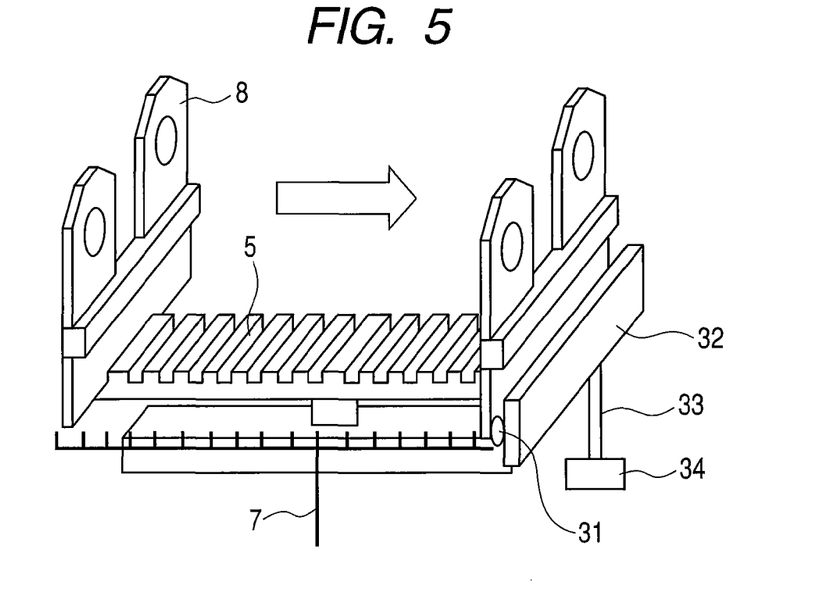
FIG. 5 is a perspective view of the substrate holder mounting device A.
Figure 6:
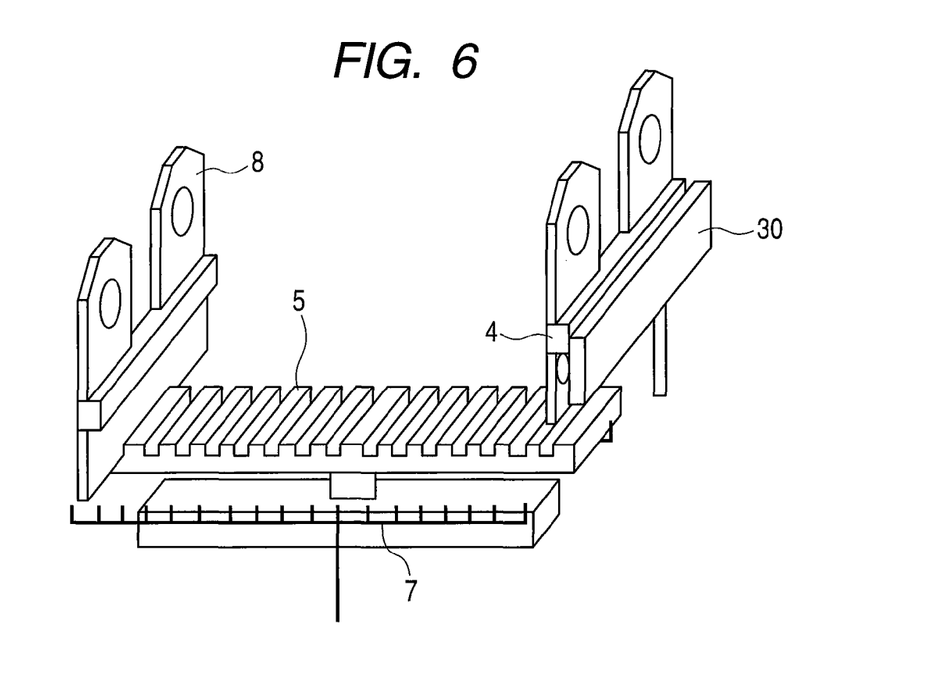
FIG. 6 is a perspective view of the substrate holder mounting device A.

Specifically, by raising the carrying roller 31 to a position shown in FIG. 6 from a standby position shown in FIG. 5, the projection 84 of the substrate holder 8 is engaged to the carrying roller 31, and then the substrate holder 8 is taken out in an up direction from the movable table 5. Subsequently, as shown in FIG. 4B, by lowering the carrying roller 31 to a carrying position where the magnet 82 of the substrate holder 8 is magnetically coupled with the carrying magnet 23, the substrate holders 8 are shifted from the movable table 5 to the carrying position. The substrate holder located on the carrying position is then carried in the lateral direction by the carrying mechanism shown in FIG. 4A. It is also possible to shift the substrate holder from the carrying position to the movable table 5 by an opposite operation.

Figure 7A:
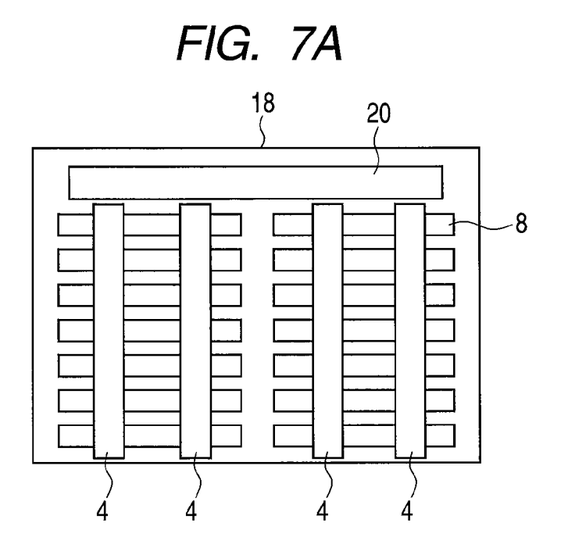
FIG. 7A is a plan view showing an arrangement of a heating mechanism in a substrate holder container chamber 18 (heater 4 in the present embodiment)
Figure 7B:
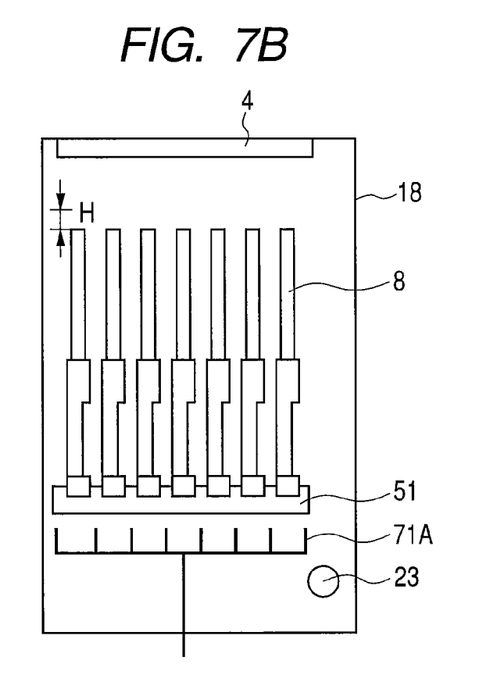
FIG. 7B is a side view of the heating mechanism.

There are shown in FIGS. 7A and 7B an arrangement of heating mechanisms in the substrate holder container chamber 18 (heaters 4 in the present embodiment). It is to be noted that FIG. 7A is a plan view and FIG. 7B is a side view.

The heaters 4 can heat the substrate holders 8 to degas etc., and they are arranged above the substrate holders 8. These arranged positions are positions where the heaters 4 do not contact with the substrate holders 8 when the holders are arranged above by the separation mechanism 7. As the heaters 4, for example, there can also be used a sheath heater etc. that heats the substrate holders 8 through heating gases as well as a lamp heater etc. that can heat the substrate holders 8 with a radiant heat. When heating, if the substrate holders 8 are set to a state where they are raised by the above-described separation mechanism 7 to be closer to the heaters 4, higher heating effect can be achieved.

It is to be noted that it is also possible to heat the substrate holders 8 by introducing a hot gas instead of using the heaters 4 or as a combination use with the heaters 4. As for a state of a pressure in the chamber at the time of heating, it is possible to heat the substrate holders 8 in a pressurized, atmospheric, or vacuum state.

[Operation of Carrying Substrate Holder]

Figures 8A, 8B, 8C, 8D, 8E, 8F:
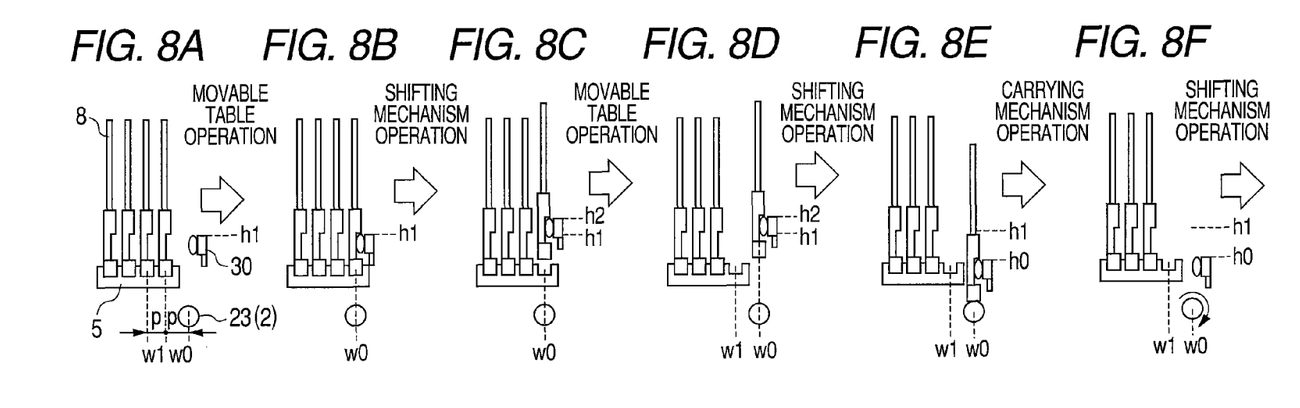
Figure 8G:
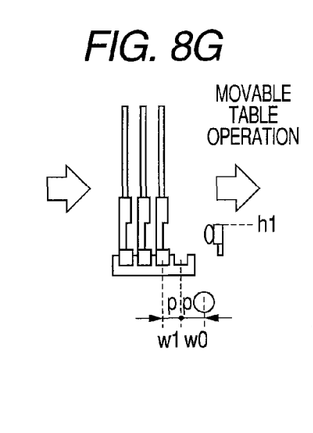
Figures 8H, 8I, 8J, 8K:
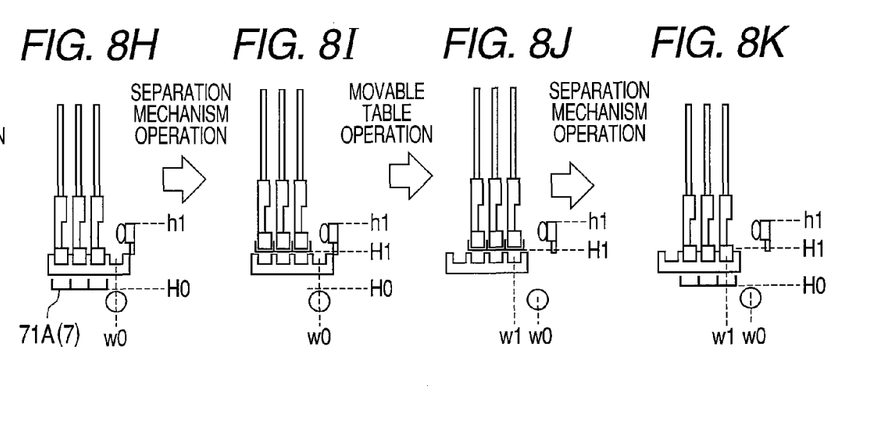
Figure 9G:
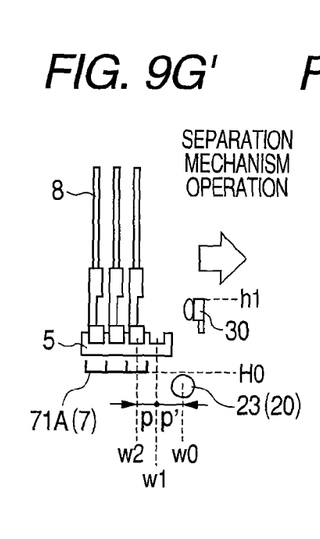
FIGS. 9G' to 9K' is another flow diagram of carrying the substrate holder out of the substrate holder container chamber 18 to the adjacent chamber.
Figure 9H:
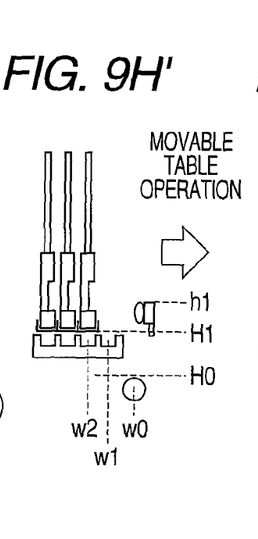
Figure 9I:
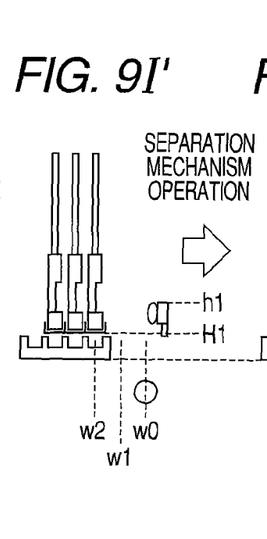
Figure 9J:
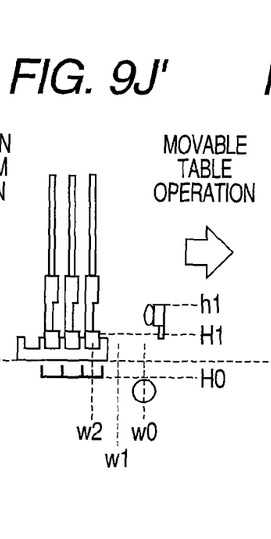
Figure 9K:
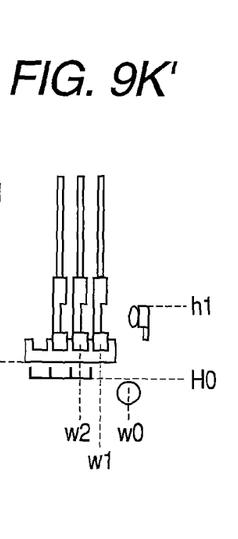

Next, there will be described operations of the substrate holder mounting devices A, the carrying mechanism 20, and the shifting mechanism 30 configured as described above. FIG. 8 shows a flow in which the substrate holder 8 is carried out of the substrate holder container chamber 18. An above-described series of operations, i.e., operation of the movable table 5, the separation mechanism 7, the carrying mechanism 20, and the shifting mechanism 30 are achieved by controlling with the programmed controller 6. It is to be noted that in order to make drawings understandable, only portions of the separation mechanism 7 required for explanation are shown in FIG. 8.

It is to be noted that in an embodiment shown in FIG. 8 to FIG. 11, the table 5 moves in a front/rear direction (horizontal direction in the drawings), the separation mechanism 7 moves in an up/down direction, the shifting mechanism 30 moves in the up/down direction and the front/rear direction, and the carrying magnet 23 is located at a fixed position (though it rotates). Hence, a positional relationship in relative movement of these mechanisms can be seen based on the carrying magnet 23.

The first half of (a) to (f) shown in FIG. 8 shows operations in which one substrate holder 8 is shifted from the movable table 5 to the carrying position H0 and W0, and then it is carried out.

(a) shows a state where the substrate holder 8 is housed in the movable table 5. The movable table 5 is operated in this state, and it is moved forward to the carrying magnet 23 side ((b)). In the present embodiment, a transporting pitch at this time is set to the same as an alignment spacing p of the substrate holder 8 on the movable table 5. Hence, a positional relationship between the movable table 5 and the carrying magnet 23 is set so that the substrate holder 8 in the front row is located exactly above the carrying magnet 23 when the movable table 5 is moved only by this pitch.

Next, the shifting mechanism 30 is moved upwardly, the carrying roller 31 is raised, the substrate holder 8 is upwardly taken out of the movable table 5 ((c)), and the movable table 5 is moved backward from this state ((d)). The shifting mechanism is then moved downwardly, the carrying roller 31 is lowered, and thereby, the substrate holder 8 is shifted to the carrying position H0 and W0 ((e)). Subsequently, the carrying magnet 23 is rotationally driven, the substrate holder 8 is carried in the lateral direction, and it is carried out of the container chamber 18 ((f)). As a result of this, one free space can be made in a groove in the front row of the movable table 5, i.e., in an arrangement space at a side end of the carrying magnet 23.

The second half of (g) to (k) shown in FIG. 8 shows an operation in which the substrate holder 8 is moved to the above-described free space of the movable table 5. The shifting mechanism 30 is moved upwardly back to the standby position from a shifting position ((g)), and the movable table 5 is moved forward to the carrying magnet 23 side only by the alignment spacing p as described above ((h)). Subsequently, the separation mechanism 7 is operated, and all the substrate holders 8 mounted on the movable table 5 are lifted upwardly to then be separated from the movable table 5 ((i)). After moving the movable table 5 backward only by the alignment spacing p in the above separated state ((j)), the separation mechanism 7 is lowered and the substrate holder 8 is moved to the movable table 5. As a result of this, the substrate holder 8 fills the above-described free space, and it is arranged on the movable table 5 in a state of being moved to the carrying magnet 23 side to less the space ((k)).

Afterwards, by repeating the (a) to (k), it is possible to sequentially carry all the substrate holders 8 arranged on the movable table 5 out of the container chamber. As described above, according to the carrying system of the present invention, the substrate holder 8 can be housed not radially but in parallel. In addition, the plurality of carrying rails are replaced with one movable table 5, and thereby the substrate holders on the movable table can be housed with a small spacing therebetween, thus enabling to reduce a size of the chamber. Simultaneously, cost reduction can be achieved by reducing carrying parts, and a working time for adjusting a position of the carrying roller can be significantly reduced.

Further, an arrangement area of the substrate holders 8 is reduced, and thereby it becomes possible to arrange the heaters 4 for degassing that cover all the holders. Simultaneously, an input amount of heat per holder increases, and thus, a time for rising temperature etc. can be reduced. Still further, with the separation mechanism between the substrate holder 8 and the movable table 5, it also becomes possible to reduce the time for rising temperature by bringing the substrate holders 8 and the heaters 4 close to each other.

[Modifications]

It is to be noted that in the present embodiment, the transporting pitch of the movable table 5 is always set to the alignment spacing p of the substrate holder 8, but the transporting pitch may be changed according to times when the substrate holders 8 are shifted between the movable table 5 and the carrying position, and when the arrangement of the substrate holders 8 in the movable table 5 is changed using the separation mechanism 7. Namely, it is necessary to set the transporting pitch per alignment spacing p when the arrangement of the substrate holders 8 is changed in the movable table 5, while it is necessary to move the movable table 5 to a position of the carrying rail 23 when the substrate holders 8 are shifted to the carrying position.

In addition, the present invention is not limited to the above-described sequence. For example, there is shown in FIG. 9 another operation example at the time of changing the arrangement of the substrate holders 8 in the movable table 5. In the example shown in FIG. 9, the substrate holder 8 is separated by the separation mechanism 7 before driving the movable table 5 from a state of (g') corresponding to (g) shown in FIG. 8 (h'), the movable table 5 is driven in a direction opposite to the carrying position in the above-described state (i'), and the substrate holder 8 is shifted to the movable table 5 (j'). A state of (k') shown in FIG. 9 corresponds to a state of (k) in FIG. 8. In this case, although an additional space is required for driving the movable table 5 in the direction opposite to the carrying position compared with the operation example in FIG. 8, interference with the carrying magnet 23 can be avoided.

In addition, since as the example in FIG. 9, a driving direction of the movable table 5 can be changed by timing of using the separation mechanism 7, and by timing of moving the movable table 5, the driving direction can be uniformed at the time of carrying the substrate holder 8 in the movable table 5 as well as carrying out by changing the timing.

Figures 10A, 10B:
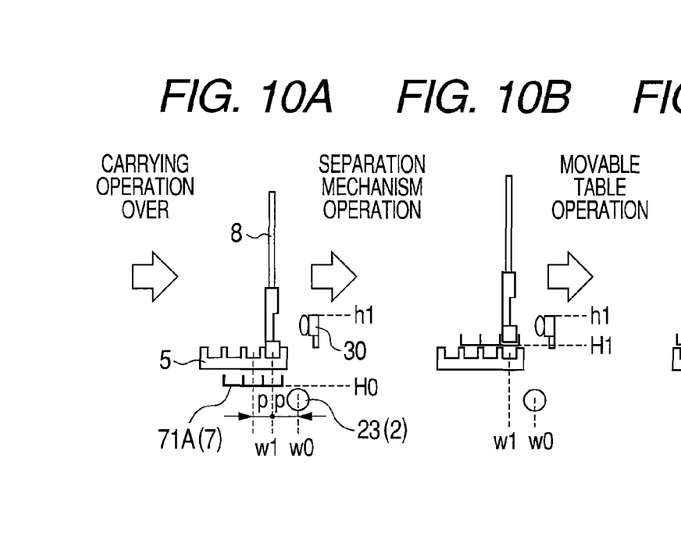
Figures 10C, 10D, 10E:
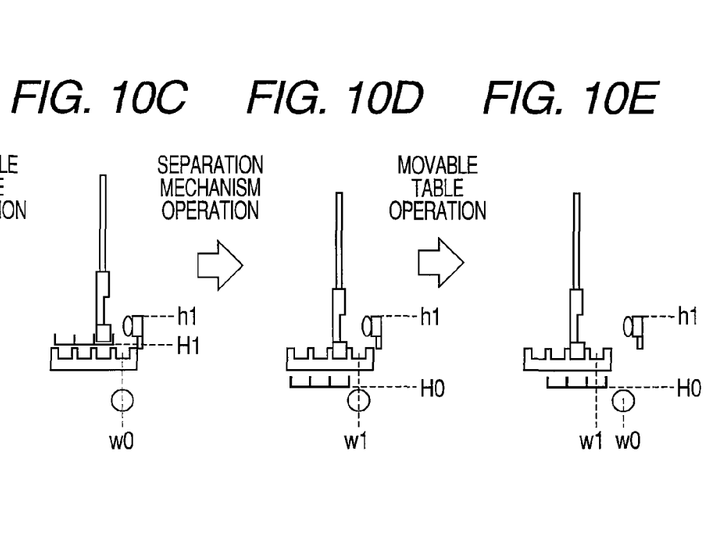
Figure 11A:
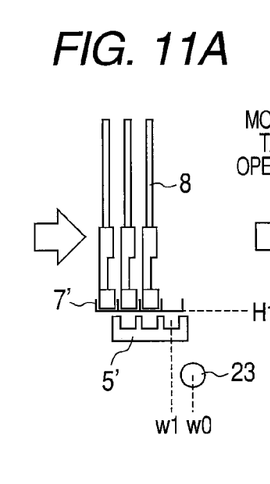
Figure 11B:
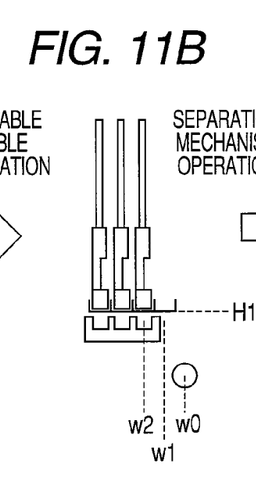
Figure 11C:
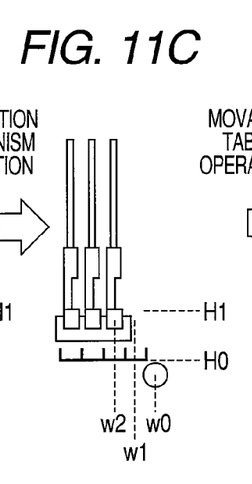
Figure 11D:
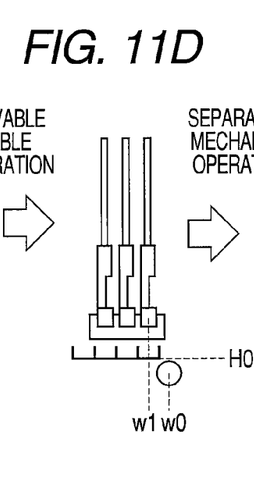
Figure 11E:
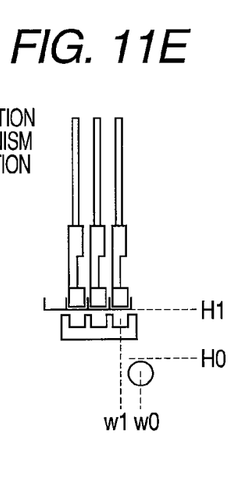

There is shown in FIG. 10 an operation example at the time of carrying-in, to which the-above described timing change is applied. FIG. 10(*a*) is in a state where the substrate holder 8 is carried to the groove in the front row of the table 5 according to the carrying position of the carrying mechanism 20. Unlike carrying-out, when carrying-in, the separation mechanism 7 is operated before driving the movable table 5 to separate the substrate holder 8 ((b)), and thereby the movable table 5 is driven to a carrying magnet 23 side (forward), thus enabling to shift the substrate holder carried to the front row to a second row ((c), (d), (e)). The substrate holder is carried from the carrying mechanism 20 to the front row of the table, and the substrate holder is sequentially transported backward by the separation mechanism 7. In this way, the substrate holders can be carried in to all the grooves of the table 5. As a result of this, a space where the movable table 5 moves can be suppressed to the minimum. As a matter of course, with a similar timing adjustment, the movable table may be driven in the direction opposite to the carrying magnet side 23 when both carrying-in and carrying, or it may be driven in the opposite direction according to when carrying-in or carrying-out without performing the timing adjustment.

In addition, although there has been described a case where the substrate holders 8 are placed upright, the present invention can also be applied, for example, to a case where the substrate holders are stacked in layers in the up/down direction (in this case, the row direction corresponds to the up/down direction). Further, although the substrate holders 8 are stacked in layers in the thickness direction of the substrate in the above-described embodiment, they may be stacked in layers in a side surface direction (in-plane direction) of the substrate.

Still further, in the above-described embodiment, the movable table 5 is moved forward and backward by one alignment spacing p, but it is not limited to this, and it may be displaced, for example, by 2 alignment spacing p or more. For example, when the carrying mechanism 20 carries two substrate holders at one time, two free spaces can be created at one time, so that the movable table 5 may be moved forward and backward by the alignment spacing p in which the substrate holders 8 are carried (in this example, by 2 alignment spacing p) so as to be able to less the spaces at once. As a matter of course, the one alignment spacing p may be repeated twice to less the free spaces.

Yet still further, in the above-described embodiment, a separation function from a mounting mechanism, and a drive in the row direction are separated into the respectively mounting mechanism to be performed, but both may be performed by the one mounting mechanism. For example, the present invention may be configured such that the movable table 5 is driven also in the up/down direction, the mounting member 71A of the separation mechanism 7 is fixed under the movable table 5, the movable table 5 is lowered, and thereby the substrate holder 8 is moved to the separation mechanism 7, and after the movable table 5 moves forward or backward, the substrate holder 8 is moved to the movable table 5 again by raising the mounting member 71A. In this case, for example, an up/down drive device, such as a cylinder, is further provided under the above-described drive mechanism 52 of the movable table 5, and then the movable table 5 is moved along with the drive mechanism 52.

In addition, the above-described embodiment is configured such that the one mounting mechanism (only the movable table 5) is driven in the row direction, but the present invention may be configured such that a drive mechanism is provided also at the second mounting mechanism, and that thereby both the first and second mounting mechanisms are alternately moved forward and backward in the row direction. Further, the above-described substrate holder container chamber is used for storing the substrate holders 8 in vacuum and for degassing, but not limited to this, and it may be used as a device that houses the substrate holder 8 in a state where the substrate is loaded thereon for the purpose of holding the substrate holder 8 until the substrate is degassed or is introduced to an adjacent room.

Still further, the above-described embodiment is configured such that a position in the row direction of the substrate holder 8 in the movable table 5 is changed by moving the movable table 5, but as shown in FIG. 11($a$), the present invention may be configured such that an arrangement in the row direction of the substrate holder 8 on the separation mechanism 7 is changed by moving the movable table 5. This operation can be achieved only by changing an operation sequence as shown in FIG. 11. FIG. 11 shows an example of a sequence in a case where the substrate holder 8 is moved to the carrying magnet 23 side to less the space when it is carried out. It is to be noted that in this case, it is preferable that the maximum mountable number of the substrate holders (number of grooves 51$a$) on the movable table 5 is set to less than the maximum mountable number thereof on the separation mechanism 7 (set to the number obtained by subtracting the number of the substrate holders carried by the carrying mechanism 20 per one time). Yet still further, since a length in the row direction of the movable table driven in the row direction can be reduced, further space saving can be achieved.

The invention claimed is:

1. An in-line system comprising:
   a substrate holder transfer path chamber in a closed loop; and
   a substrate holder container chamber connected to the path chamber for one of introducing a substrate holder to the path chamber and for carrying the substrate holder in from the path chamber;
   wherein the substrate holder container chamber comprises:
   a moveable table that is horizontally movable in a forward direction and a rearward direction, the forward direction and the rearward direction being opposite to each other, the moveable table maintaining a plurality of substrate holders arranged side-by-side in the forward and rearward directions and, when the moveable table is moved, moving all of the plurality of substrate holders at one time in the same direction, the same direction being one of the forward direction and rearward direction;
   a moveable table drive mechanism configured to move the moveable table in the forward direction and rearward direction;
   a resting unit that (a) rests all of the plurality of substrate holders maintained by the movable table, (b) is moveable in an upward direction so as (i) to lift up all of the plurality of substrate holders maintained by the movable table and (ii) to separate all of the plurality of substrate holders from the movable table at one time, and (c) is moveable in a downward direction so as to lower all of the separated plurality of substrate holders onto the movable table at one time;
   a resting unit drive mechanism configured to move the resting unit in the upward direction and downward direction; and
   a controller configured to control the movable table drive mechanism and the resting unit drive mechanism, the controller being configured to:

(i) operate the resting unit drive mechanism to move the resting unit in the upward direction;

(ii) operate the moveable table drive mechanism to move the movable table in the forward and rearward directions while the resting unit lifts up all of the plurality of substrate holders maintained by the movable table from the movable table; and (iii) operate, subsequently, the resting unit drive mechanism to move the resting unit in the downward direction to lower the separated plurality of substrate holders onto the moved movable table, whereby positions of all of the plurality of substrate holders maintained by the movable table are shifted on the movable table along the forward and rearward directions.

2. The in-line system according to claim 1, wherein a plurality of grooves are formed on the movable table at equal intervals and side-by-side in the forward and reward directions, each of the plurality of grooves being configured to maintain one of the plurality of substrate holders, and the resting unit has a plurality of maintaining portions at intervals which are identical to the intervals of the plurality of grooves of the movable table.

3. The in-line system according to claim 2, further comprising a carrying mechanism which performs one of carrying the substrate holder on a first groove of the plurality of grooves of the movable table out from the substrate holder container chamber and carrying the substrate holder in from outside of the substrate holder container onto the first groove.

4. The in-line system according to claim 3, wherein, every time the carrying mechanism carries the substrate holder on the first groove out from the substrate holder container chamber, the controller is configured to control the movable table drive unit and the resting unit drive unit so as to move the substrate holder on a second groove of the plurality of grooves of the movable table to the first groove.

5. The in-line system according to claim 3, wherein, every time the carrying mechanism carries the substrate holder in from outside of the substrate holder container chamber onto the first groove, the controller is configured to control the movable table drive unit and the resting unit drive unit so as to move the substrate holder on the first groove to a second groove of the plurality of grooves of the movable table.

6. The in-line system according to claim 1, wherein the controller is configured to control the movable table drive unit and the resting unit drive unit such that a movement of the movable table in the forward and rearward directions and a movement of the resting unit in the upward and downward directions occur alternately.

7. A substrate holder container chamber comprising:

a movable table that is horizontally movable in a forward direction and a rearward direction, the forward direction and the rearward direction being opposite to each other, and the movable table maintaining a plurality of substrate holders arranged side-by-side in the forward and rearward directions;

a moveable table drive mechanism configured to move the moveable table in the forward direction and rearward direction;

a resting unit that (a) rests all of the plurality of substrate holders maintained by the movable table, (b) is moveable in an upward direction so as (i) to lift up all of the plurality of substrate holders maintained by the movable table and (ii) to separate all of the plurality of substrate holders from the movable table at one time, and (c) is moveable in a downward direction so as to lower all of the separated plurality of substrate holders onto the movable table at one time;

a resting unit drive mechanism configured to move the resting unit in the upward direction and downward direction; and a controller configured to control the movable table drive mechanism and the resting unit drive mechanism, the controller being configured to:

(i) operate the resting unit drive mechanism to move the resting unit in the upward direction;

(ii) operate the moveable table drive mechanism to move the movable table in the forward and rearward directions while the resting unit lifts up all of the plurality of substrate holders maintained by the moveable table from the movable table; and (iii) operate, subsequently, the resting unit drive mechanism to move the resting unit in the downward direction to lower the separated plurality of substrate holders onto the moved movable table, whereby positions of all of the plurality of substrate holders maintained by the movable table are shifted on the movable table along the forward and rearward directions.

* * * * *